United States Patent [19]

Knolle et al.

[11] Patent Number: 5,107,323
[45] Date of Patent: Apr. 21, 1992

[54] PROTECTIVE LAYER FOR HIGH VOLTAGE DEVICES

[75] Inventors: William R. Knolle, Macungie; John W. Osenbach, Sinking Springs, both of Pa.

[73] Assignee: AT&T Bell Laboratories, Murray Hill, N.J.

[21] Appl. No.: 702,439

[22] Filed: May 16, 1991

Related U.S. Application Data

[63] Continuation of Ser. No. 288,300, Dec. 22, 1988, abandoned.

[51] Int. Cl.$^5$ ............................................. H01L 29/34
[52] U.S. Cl. .................................. 357/54; 357/52; 357/53
[58] Field of Search .................... 357/54, 61, 52, 53

[56] References Cited

U.S. PATENT DOCUMENTS

| | | | |
|---|---|---|---|
| 4,009,483 | 2/1977 | Clark | 357/52 |
| 4,097,889 | 6/1978 | Kern et al. | 357/54 |
| 4,365,264 | 12/1982 | Mukai et al. | 357/54 |
| 4,532,022 | 7/1985 | Takasaki et al. | 204/192 D |
| 4,717,631 | 1/1988 | Kaganowicz et al. | 148/33.3 |
| 4,901,133 | 2/1990 | Curran et al. | 357/54 |

FOREIGN PATENT DOCUMENTS

| | | | |
|---|---|---|---|
| 61-95515 | 5/1986 | Japan | 357/54 |
| 63-184340 | 7/1988 | Japan | 357/54 |

OTHER PUBLICATIONS

Osenbach, J. W. et al., "A Model Describing the Electrical Behavior of a-SiN:H Alloys", J. Appl. Phys. 15 Aug. 1986, pp. 1408-1416.

Sze, S. M., Physics of Semiconductor Devices, 2nd ed., John-Wiley 1981, p. 852.

Primary Examiner—Andrew J. James
Assistant Examiner—Sara W. Crane
Attorney, Agent, or Firm—L. H. Birnbaum

[57] ABSTRACT

A semi-insulating layer is formed over a high voltage device in order to protect the device substrate from charge buildup. A layer comprising silicon oxynitride is deposited over the semi-insulating layer in order to prevent arcing between device electrodes and provide corrosion resistance.

8 Claims, 3 Drawing Sheets

PROTECTIVE LAYER FOR HIGH VOLTAGE DEVICES

This application is a continuation of application Ser. No. 07/288,300, filed on Dec. 22, 1988 now abandoned.

BACKGROUND OF THE INVENTION

This invention relates to high voltage semiconductor devices.

A significant problem inherent in semiconductor devices and circuits operating at high voltages (in excess of 30 volts) is the buildup of charge on the top surface of the outermost passivation layer. Among other adverse effects, such charge collection can cause a reduction in the breakdown voltage of the device due to inversion of the semiconductor surface.

In order to alleviate the problem, a field shield layer is typically employed. This layer is usually a semi-insulating layer which conducts enough current to neutralize the charge buildup without causing excessive leakage currents. Semi-insulating silicon nitride has been shown to be an excellent material for such purposes (see U.S. Patent Application of Knolle and Osenbach, Ser. No. 110,153 filed Oct. 19, 1987). Semi-insulating polycrystalline silicon has also been proposed (see, e.g., U.S. Pat. No. 4,009,483 issued to Clark).

Another problem has arisen, however, when such semi-insulating layers are employed. That is, conduction at the surface of the layer at sufficiently high voltages can cause arcing between electrodes through the air. This results in a considerable number of device failures during temperature-humidity-bias testing.

A further problem which often arises in high voltage applications is moisture-related corrosion failures. Such failures are apparently caused by water condensation in voids which exist in the semi-insulating or other layers. In the case of silicon nitride layers, the water etches the layer and also creates $NH_4^+$ ions. This reaction continues until it reaches the underlying metallization, and the water and ions then etch the metal causing a corrosion failure.

It is, therefore, an object of the invention to provide high voltage semiconductor devices with reduced failures due to arcing and corrosion.

SUMMARY OF THE INVENTION

This and other objects are achieved in accordance with the invention which is a high voltage semiconductor device comprising a semiconductor substrate, at least one localized region of a certain conductivity type formed at the surface of the substrate, and an electrical contact formed to said localized region. A semi-insulating layer is formed over the substrate, and a layer comprising silicon oxynitride is formed on the semi-insulating layer.

BRIEF DESCRIPTION OF THE DRAWING

These and other features are delineated in detail in the following description. In the drawing.

It will be appreciated that, for purposes of illustration, these figures are not necessarily drawn to scale.

DETAILED DESCRIPTION

Figure 1:
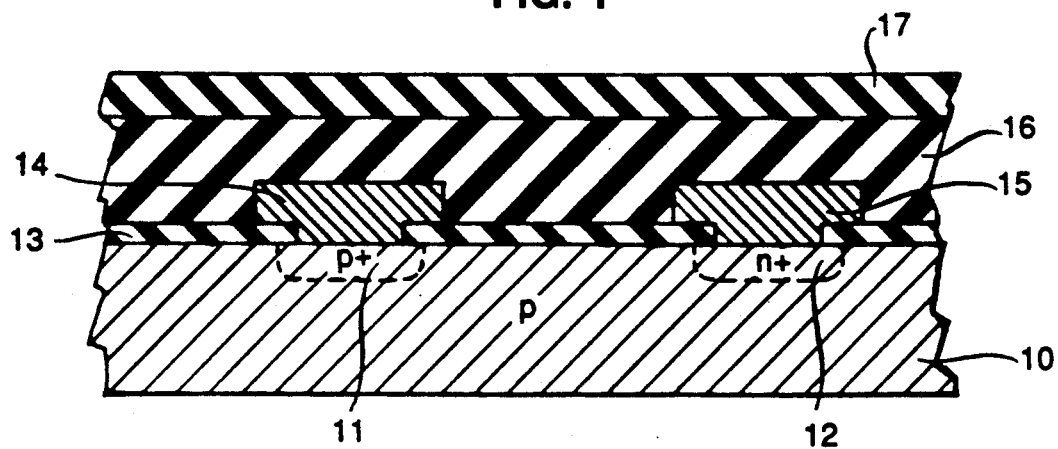
FIG. 1 is a cross-sectional view of a high voltage device in accordance with one embodiment of the invention.

FIG. 1 illustrates in cross section a typical high voltage semiconductor device in accordance with the invention. It will be appreciated that the device is typically part of an integrated circuit including many other elements. It will also be understood that the particular form of the device is presented for exemplary purposes, and could take many other forms.

The device is built into a semiconductor substrate, 10, which is usually silicon. The substrate in this example is doped with boron so as to exhibit a p-type conductivity with a concentration of approximately $10^{15}$ per $cm^3$. The substrate is approximately 20 mils thick. Localized regions, 11 and 12, are formed at the surface of the substrate by selectively doping the surface in accordance with standard photolithographic techniques. In this example, region 11 has the same conductivity type (p) as the substrate, but a higher impurity concentration (approximately $10^{19}$ per $cm^3$). Region 12 has a conductivity type (n) which is opposite to the substrate and has an impurity concentration of $10^{19}$ per $cm^3$. An insulating layer, 13, is formed on the surface of the semiconductor. This layer is typically $SiO_2$ which is formed by thermal oxidation to a thickness of 100–1,000 nm. Openings in the layer 13 over the localized regions 11 and 12 are formed by standard lithographic techniques. Metal contacts 14 and 15 are formed in the openings in order to provide electrical contact to regions 11 and 12, respectively. The metal is typically aluminum formed by sputtering to a thickness of approximately 1 $\mu m$.

In order to protect the semiconductor from charge buildup on insulating layer 13, a semi-insulating layer 16 is formed over layer 13 as well as contacts 14 and 15. In this example, the layer was a semi-insulating silicon nitride layer formed by plasma deposition utilizing $NH_3$ and $SiH_4$. The thickness of the layer was in the range 0.5–0.8 $\mu m$. Preferably, the conductivity of layer 16 is within the range $10^{-9}-10^{-14}(\Omega\text{-cm})^{-1}$. (For more details on the formation of semi-insulating SiN, see U.S. Patent Application of Knolle, et al previously cited). While use of semi-insulating silicon nitride has been described in this example, it will be appreciated that the invention can also be used with semi-insulating polycrystalline silicon (SIPOS) layers, or any other semi-insulating layer which is capable of performing as a field shield layer in high voltage devices.

In accordance with a main feature of the invention, a layer, 17, comprising silicon oxynitride ($SiO_yN_x$), was deposited on the semi-insulating layer 17. The layer has a high dielectric breakdown strength (preferably greater than $10^6$ V/cm) in order to prevent arcing as a result of current in the underlying semi-insulating layer 16. In addition, it has been found that a silicon oxynitride layer essentially eliminates interface leakage currents which can be a problem where a silicon nitride layer is formed instead over the semi-insulating SiN layer 16 after the structure is removed from the plasma reactor to test the layer 16. This advantage of the oxynitride layer is believed due to the tying up of dangling silicon bonds at the surface of the semi-insulating layer by the oxynitride layer.

The insulating layer 17 is formed over essentially the entire area of the device except for portions used to provide access to metal contacts 14 and 15. In order to prevent arcing, it is recommended that the thickness of the layer be within the range 0.2–1.0 $\mu$m.

Figure 2:
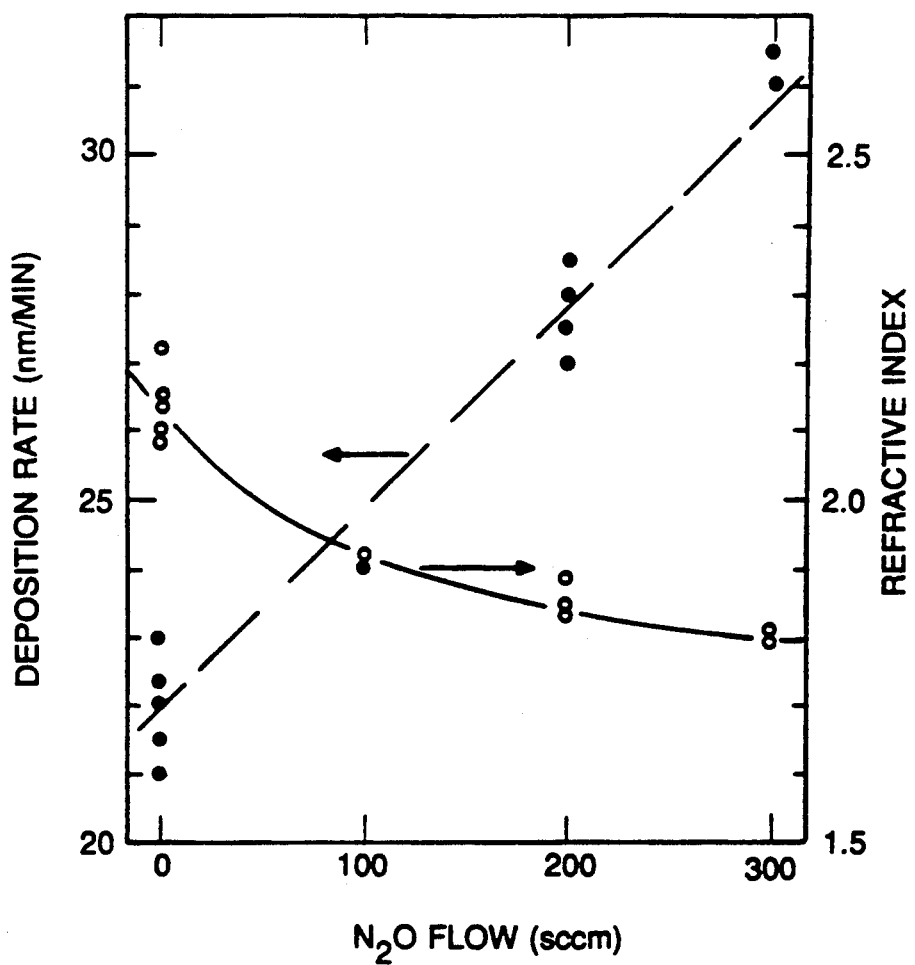
FIG. 2 is a graph of deposition rate and refractive index as a function of $N_2O$ flow rate for various silicon oxynitride layers fabricated in accordance with an embodiment of the invention.
Figure 3:
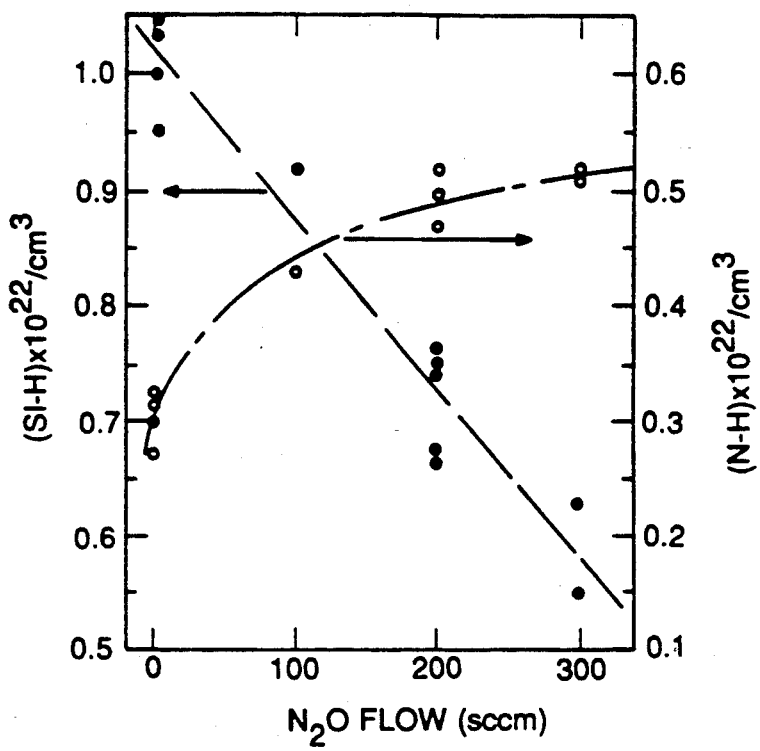
FIG. 3 is a graph of Si-H and N-H content as a function of $N_2O$ flow rate for various silicon oxynitride layers fabricated in accordance with the same embodiment.

In a preferred embodiment, the layer 17 was deposited by rf plasma deposition in a standard chamber utilizing $NH_3$, $SiH_4$ and $N_2O$ gases. The flow rates of $NH_3$ and $SiH_4$ were set at 1100 sccm and 140 sccm, respectively, while the $N_2O$ flow rate was varied from 0–300 sccm. The effects of flow rate on deposition rate and refractive index of the deposited layer are shown in FIG. 2. The effects of flow rate on Si-H and N-H concentration are shown in FIG. 3. The layer, 17, formed by this technique, therefore, is an amorphous silicon oxynitride alloyed with hydrogen (a:$SiON_x$:H). However, similar results should be produced for silicon oxynitride without the hydrogen component.

Figure 4:
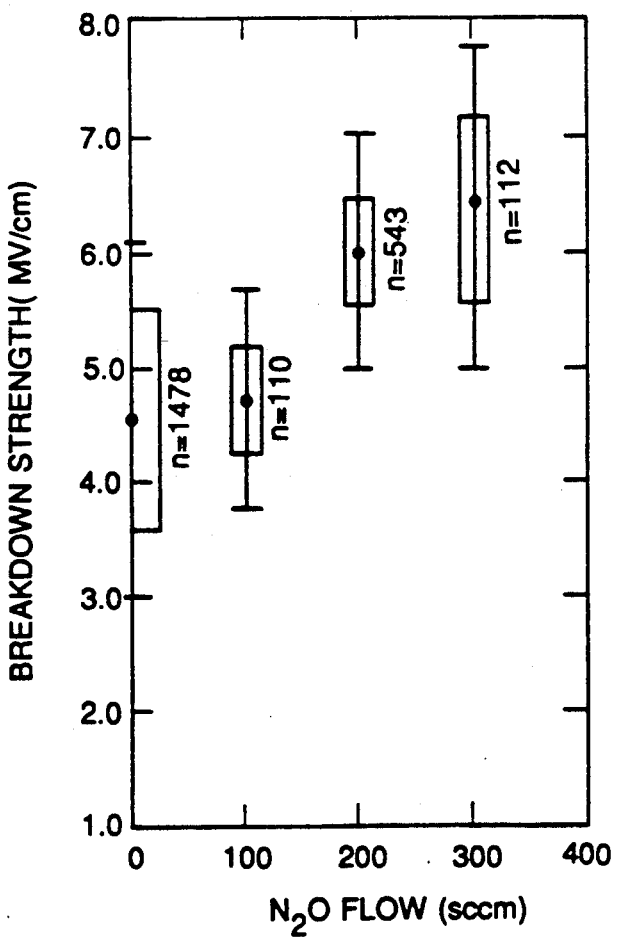
FIG. 4 is a graph of the breakdown strengths for silicon oxynitride layers in accordance with an embodiment of the invention.

The choice of an appropriate oxygen concentration is an important factor in the fabrication of layer 17, and this concentration is controlled by the $N_2O$ flow rate as indicated by the change in refractive index of FIG. 2. As illustrated in FIG. 4, the breakdown strength of the film tends to increase for increasing $N_2O$ flow rate and oxygen content. (In the graph, "n" indicates the number of samples measured, the boxes show the three sigma limit of the distributions measured, and the dots show the average values.) However, it was also discovered that other characteristics such as dielectric constant and resistance to sodium migration tend to decrease with increasing concentration. An optimum oxygen atom concentration therefore is approximately 17 percent of the total number of atoms, and a preferred range is 12–17.5 percent. Oxygen concentrations above this range tend to result in too high a dependence of sodium migration as a function of voltage, while concentrations below this range exhibit high stress and are susceptible to cracking. In order to provide optimum electrical characteristics, low stress, high resistance to sodium penetration and an appropriate dielectric constant, it is also preferred to keep the ratio of Si to O and N ions in the range of 50/50 and 40/60.

Figure 5:
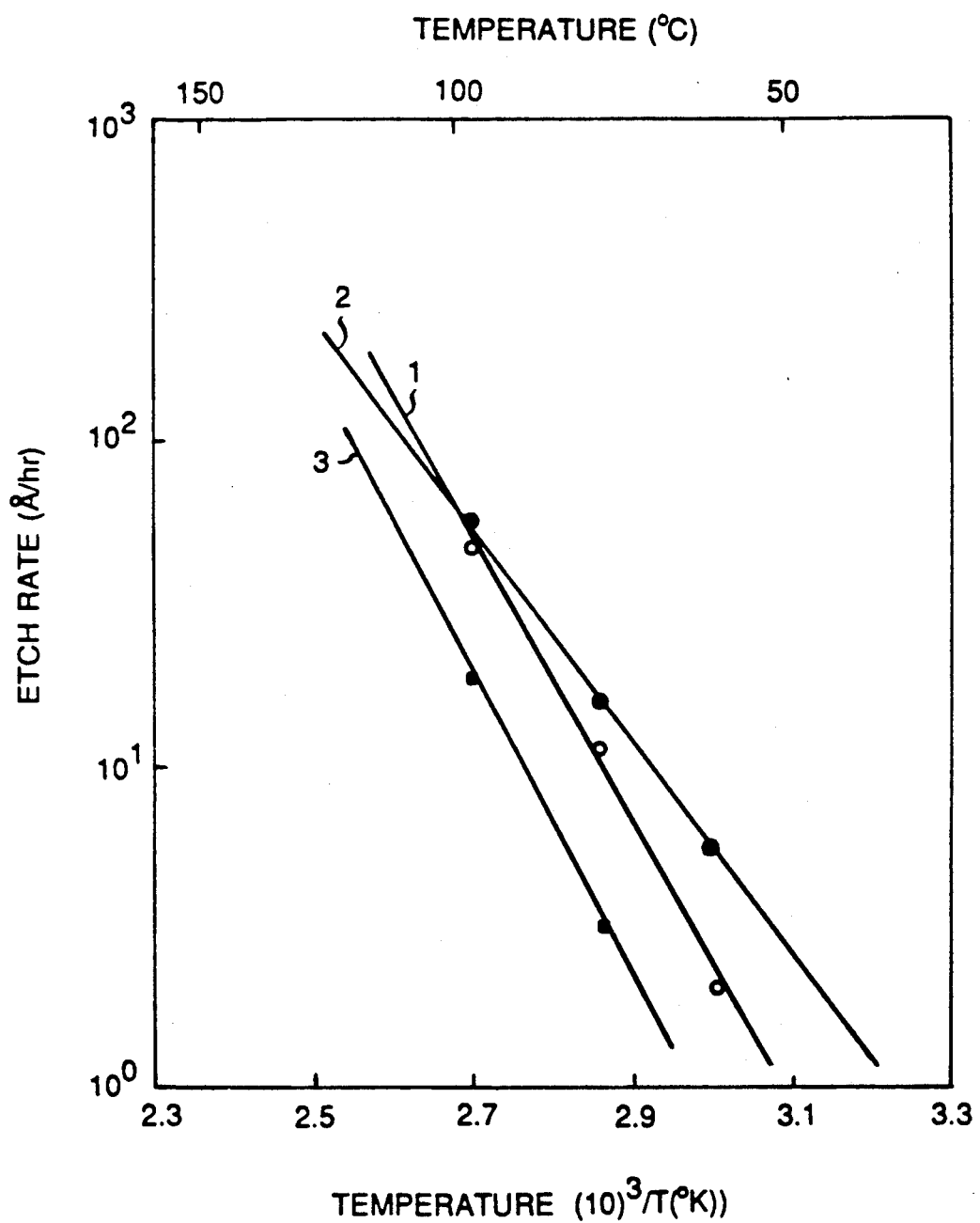
FIG. 5 is a graph of the etch rates in water for a silicon oxynitride layer in accordance with an embodiment of the invention, a conventional insulating silicon nitride layer, and a semi-insulating silicon nitride layer.

Devices fabricated with the combination of semi-insulating SiN and silicon oxynitride as described above showed no damage as a result of arcing when subjected to 800 volts. A further benefit of using the oxynitride overcoating was the resulting increased resistance to corrosion due to moisture over devices using only the semi-insulating layer or including a silicon nitride overcoating. This is demonstrated in FIG. 5 where the etch rate in water of a semi-insulating SiN layer (curve 1) is shown along with the etch rate of a silicon nitride insulator (2) and the etch rate of a silicon oxynitride layer (3) fabricated in accordance with the above technique.

It will be appreciated that, while the silicon oxynitride layer is most advantageous as the outermost layer as shown in FIG. 1, it can also be used as an interlevel dielectric adjacent to a semi-insulating layer to provide reduced interface leakage currents.

Various additional modifications will become apparent to those skilled in the art. All such variations which basically rely on the teachings through which the invention has advanced the art are properly considered within the scope of the invention.

We claim:

1. A high voltage semiconductor device comprising a semiconductor substrate;
   a plurality of localized regions formed at the surface of said substrate;
   electrical contacts formed to said localized regions;
   a semi-insulating layer formed over said substrate and said contacts; and
   an insulating layer comprising silicon oxynitride formed on said semi-insulating layer and over said contacts in order to prevent arcing between said contacts.

2. The device according to claim 1 wherein the silicon oxynitride layer is the outermost layer of the device.

3. The device according to claim 1 wherein the semi-insulating layer comprises silicon nitride.

4. The device according to claim 1 wherein the silicon oxynitride layer is an amorphous alloy of silicon oxynitride and hydrogen.

5. The device according to claim 1 wherein the silicon oxynitride layer has an oxygen atom content within the range 12–17.5 percent.

6. The device according to claim 1 wherein the silicon oxynitride layer has a concentration of Si to oxygen and nitrogen ions within the range 50/50 and 40/60.

7. The device according to claim 1 wherein the thickness of the silicon oxynitride layer is within the range 0.2–1.0 $\mu$m.

8. A high voltage semiconductor device comprising:
   a semiconductor substrate;
   a plurality of localized regions formed at the surface of said substrate;
   electrical contacts formed to said localized regions;
   a semi-insulating silicon nitride layer formed over said substrate and said contacts; and
   an outermost insulating layer comprising an alloy of silicon oxynitride and hydrogen formed on said semi-insulating layer and over said contacts in order to prevent arcing between said contacts, the oxygen atom content of said silicon oxynitride layer lying within the range 12–17.5 percent, and the ratio of Si to oxygen and nitrogen ions lying in the range 50/50 to 40/60.

* * * * *